US009214950B1

(12) United States Patent
Davis et al.

(10) Patent No.: US 9,214,950 B1
(45) Date of Patent: Dec. 15, 2015

(54) APPARATUS AND METHOD FOR TEMPERATURE COMPENSATED GAIN AND MISMATCH TRIM IN SUBRANGING QUANTIZERS AND ANALOG TO DIGITAL CONVERTERS

(71) Applicant: Lockheed Martin Corporation, Bethesda, MD (US)

(72) Inventors: Brandon R. Davis, Mount Laurel, NJ (US); Toshi Omori, Manlius, NY (US); Lloyd F. Linder, Agoura Hills, CA (US); Victoria T. Pereira, Moorestown, NJ (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 14/694,428

(22) Filed: Apr. 23, 2015

(51) Int. Cl.
 *H03M 1/00* (2006.01)
 *H03M 1/08* (2006.01)
 *H03M 1/12* (2006.01)
 *H03M 1/36* (2006.01)

(52) U.S. Cl.
 CPC .............. *H03M 1/089* (2013.01); *H03M 1/001* (2013.01); *H03M 1/00* (2013.01); *H03M 1/12* (2013.01); *H03M 1/365* (2013.01)

(58) Field of Classification Search
 CPC .......... H03M 1/00; H03M 1/365; H03M 1/12
 USPC .......................... 341/110, 158, 159, 155, 156
 See application file for complete search history.

(56) References Cited

U.S. PATENT DOCUMENTS

| 5,376,937 | A | 12/1994 | Colleran et al. | |
|---|---|---|---|---|
| 8,692,529 | B1 | 4/2014 | Wyatt | |
| 2005/0030216 | A1 | 2/2005 | Linder et al. | |
| 2005/0128118 | A1* | 6/2005 | Devendorf et al. | ........... 341/158 |

OTHER PUBLICATIONS

Sone, K., et al., "A 10-b 100-Msample/s Pipelined Subranging BiCMOS ADC", IEEE Journal of Solid-State Circuits, vol. 28, No. 12, Dec. 1993, pp. 1180-1186.
Sone, K., et al., "A 10b 100Ms/s Pipelined Subranging BiCMOS ADC", Solid-State Circuit Conference 1993, Digest of Technical Papers, 40th ISSCC, Feb. 24, 1993, pp. 66-67.

* cited by examiner

*Primary Examiner* — Joseph Lauture
(74) *Attorney, Agent, or Firm* — Howard IP Law Group, PC

(57) ABSTRACT

A flash analog to digital converter (ADC) provides a temperature compensated trim current by applying a first temperature compensated reference current across a replica resistor ladder. The reference current is mirrored to a trim digital to analog converter, which outputs a fractional portion of the temperature compensated reference current. The proportional trim current is then fed back to the reference current to provide a trimmed temperature compensated reference current. The trimmed reference current is mirrored across the output resistor ladder providing a trimmed current in which the trim varies along with temperature changes due to the trim current being a proportion of the temperature compensated reference current. A proportional trim current which varies with temperature changes is applied to the gain current trim and mismatch current trim in a DAC of a quantizing stage of a sub-ranging ADC.

20 Claims, 9 Drawing Sheets

APPARATUS AND METHOD FOR TEMPERATURE COMPENSATED GAIN AND MISMATCH TRIM IN SUBRANGING QUANTIZERS AND ANALOG TO DIGITAL CONVERTERS

FIELD OF THE INVENTION

This disclosure relates to electronic circuits. More particularly, this disclosure related to analog to digital converters (ADCs) and digital to analog converters (DACs).

BACKGROUND OF THE INVENTION

A flash or parallel ADC is a type of analog-to-digital converter that uses a resistor ladder having multiple resistors in series and providing taps between resistors. A flash ADC converts an analog signal to a digital signal faster than other ADC architectures and provides operation across a large bandwidth, albeit at relatively low resolution. The flash ADC is widely used in high frequency applications where the higher frequency signal cannot be handled in other ways. A flash ADC operates through a cascade of high speed comparators. FIG. 1 is a simplified schematic diagram of a flash ADC 100. A reference voltage $V_{ref}$ 101 is provided to a number of series connected resistors $103_1$-$103_n$, where n is related to the resolution bits of the flash ADC 100. The number of resistors, r, is calculated as $r=2^n-1$ where n is the number of resolution bits. Therefore, for a 3-bit flash ADC, such as the flash ADC 100 depicted in FIG. 1, $2^3-1=7$ resistors are required. Flash ADCs are generally limited to 8 bits of resolution. Thus, an 8-bit flash ADC would require $2^8-1$, or 255 resistors. Each resistor $103_1$-$103_n$ produces a voltage drop which produces a voltage representing one significant bit of the output 117 of the flash ADC 100. Voltages associated with each resistor 103, denoted $V_1$-$V_n$ may be measured at corresponding nodes $105_1$-$105_n$.

The analog input voltage $V_{in}$ 107 is applied to a plurality of comparators $111_1$-$111_n$ where each comparator 111 is associated with a voltage level 105 in the reference voltage divider network 104. For each reference voltage level 105, the reference voltage is compared to the input signal voltage 109. If the input signal voltage 109 is greater than the reference voltage level 105, the corresponding comparator 111 is saturated and outputs a "1" value. If the reference voltage level 105 is greater than the input signal voltage 109, then the comparator 111 outputs a "0" value. Since each reference voltage level is lower at a given node than the reference voltage level of a preceding node (above it) in the resistor ladder, if a given comparator 111 determines that the input signal voltage 111 is higher than its corresponding reference voltage level 105 and outputs a "1", then each comparator below that comparator in the ladder should also output a "1". Accordingly, the set of comparators 111 outputs a series of consecutive 1's, up to the capacitor corresponding to the reference voltage level 105 closest to the input signal voltage 109; and outputs consecutive 0's for all comparators above that level. These strings of 1's and 0's are output to encoder 115, which converts them to an equivalent binary output value 117.

A comparator 111 is coupled to each tap 105, 109 of the ladder and compares the input voltage 109 to successive reference voltages 105. The output of comparators 111 is generally fed into a digital encoder 115 via latch circuits $113_1$-$113_n$, which converts the inputs into a binary value output 117. Flash ADCs require a temperature compensated reference current in order to generate stable voltage drops 105 across the quantizing resistor ladder. Traditionally, this is accomplished through replica biasing. In addition, voltage drops across the resistor ladder must be trimmed to appropriate voltages to account for process variations.

Existing solutions typically trim the voltage at the emitters of the biasing transistors, either through a voltage digital to analog converter (DAC) or by directly adjusting the resistances through etching processes. Etching processes may only be performed during manufacture. However, these trimming methods introduce a non-temperature compensated offset to the voltages which degrades performance. Laser trimming of resistances within the reference circuitry may also be used. Laser trimming requires additional manufacturing steps and more robust measurement techniques during production and therefore adds significant cost to the final product. Alternative devices and methods for temperature compensated gain and mismatch trim which address one or more of these problems is desired.

SUMMARY

An analog to digital converter (ADC) for providing a temperature compensated trim current which varies with temperature changes within the ADC includes a first current source configured to produce a temperature compensated reference current. A current mirror is configured to reproduce the temperature compensated reference current at a second current source. A first trim digital to analog converter (DAC) receives the reproduced temperature compensated reference current from the second current source and outputs a fractional portion or ratio of the reproduced temperature compensated reference current to produce the temperature compensated trim current. The temperature compensated trim current and the temperature compensated reference current are combined at the first current source to generate an adjusted temperature compensated reference current. The adjusted reference current is applied across a replica resistor ladder to produce desired or target voltage levels at nodes between the resistors of the replica resistor ladder. The adjusted temperature compensated reference current is then mirrored across an output resistor ladder to produce voltage references levels at nodes between adjacent resistors in the output resistor ladder. An input signal is applied to a plurality of comparator circuits wherein each comparator circuit is associated with one of the nodes. The comparator circuit receives an input signal voltage level and the voltage reference level voltage at the associated node and outputs a digital signal representative of the input signal voltage level.

A sub-ranging analog to digital converter includes a plurality of pipelined quantizing stages. Each stage includes a flash ADC, DAC, and an encoder. The flash ADC includes circuitry for providing a temperature compensated trim current which varies with temperature variations in the ADC. The DAC receives a digital output signal from the flash ADC and converts the signal back to an analog signal, which is subtracted from the original input signal to produce an input signal for the next quantizing stage. The DAC includes a gain current trim circuit which utilizes a trim DAC for outputting a temperature compensated trim current which is a fractional portion of a temperature compensated reference current provided to the trim DAC. The DAC further includes a mismatch trim current circuit which includes a second trim DAC for outputting a temperature compensated trim current which is a fractional portion of the temperature compensated reference current to compensate for mismatches in the DAC components.

A method for temperature compensated trimming for a temperature compensated reference current in an analog to digital converter includes providing a temperature compensated reference current in a first current source across a first resistor ladder comprising a plurality of series connected resistors. The temperature compensated reference current is mirrored in a current mirror to a second current source. The mirrored temperature compensated reference current is applied to a trim digital to analog converter DAC, which outputs a fractional portion of the temperature compensated reference current as a temperature compensated trim current. The temperature compensated trim current is fed back into the temperature compensated reference current to produce an adjusted temperature compensated reference current.

DETAILED DESCRIPTION

A flash analog to digital converter (ADC) requires a temperature compensated reference current in order to generate stable voltage drops across the architecture's quantizing resistor ladder. This is generally accomplished through replica biasing using a replica resistor ladder. In addition, voltage drops in the actual or output resistor ladder must be trimmed to the appropriate voltages to account for process variations. Conventional methods introduce a non-temperature compensated offset to the voltages resulting in a degradation of performance.

The resistors in the resistor ladder are temperature sensitive. That is, as temperature changes, the resistance value of each resistor also changes. For example, when the temperature of the resistor ladder increases, the resistance of each resistor in the resistor ladder may decrease. A constant reference current applied across the resistor ladder will cause the voltage drop across the resistor ladder to change with temperature, which is undesirable. As shown in the chart of FIG. 2, a resistor ladder with no temperature compensation and a desired voltage across the ladder of 240 mV, may range anywhere from 227 mV to about 243 mV across a temperature range of 0° Celsius to 125° C.

Figure 1:
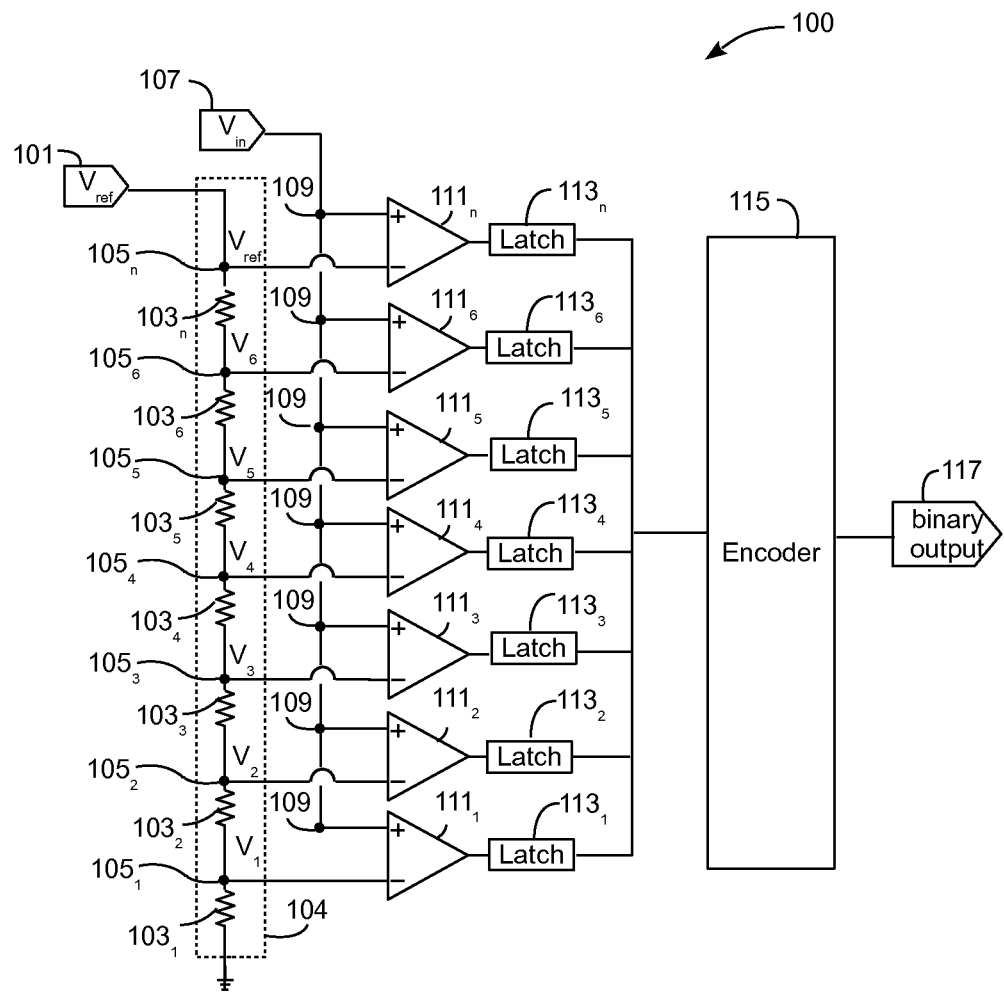
FIG. 1 is a schematic diagram of a conventional analog to digital converter (ADC).
Figure 2:
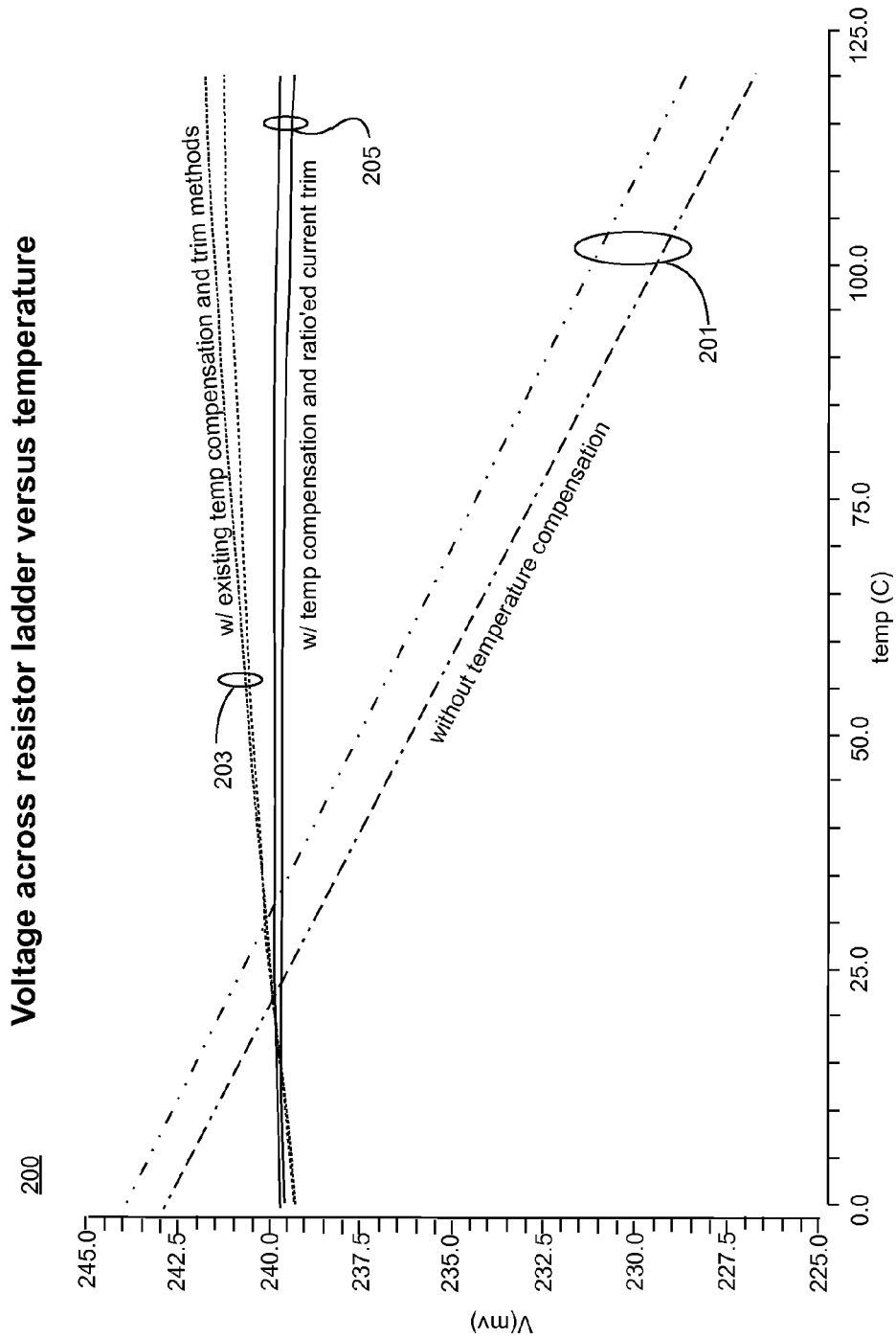
FIG. 2 is a graphical depiction showing voltage drops across a resistor ladder over a range of temperatures showing temperature compensated and non-temperature compensated output values according to an embodiment of the disclosure.

FIG. 2 is a graphical depiction 200 of a reference voltage measured across a quantizing resistor ladder over a range of varying temperatures from 0° C. to 125.0° C. Each pair of plot lines represents a differential input applied to two legs of the resistor ladder. The voltage measured across the resistor ladder when no temperature compensation is provided is shown by plot lines 201. For a desired voltage drop of 240 mV, the non-compensated resistor ladder varies from about 244 mV at 0° C. down to about 227.5 mV when the temperature approaches 125° C. This variation in voltage occurs as the resistance value of the resistors in the ladder vary as temperature changes. As temperature increases, the resistance of each resistor decreases. Therefore, for a constant reference current, the voltage also decreases.

Using conventional voltage trimming methods such as resistance trimming or voltage trimming, the reference voltage changes as shown in plot lines 203. Using conventional techniques, the voltage varies from about 239 mV to about 242 mV. While this provides improvement over the non-temperature compensated circuit, changes in temperature still introduce factors that cause the reference voltage to change with temperature. This results from the fact that conventional voltage trimming methods typically use a base current that is temperature compensated. The temperature compensated base current is applied to the resistor ladder that acts as a voltage divider. To compensate for temperature changes in the resistor ladder, an additional temperature compensation current is provided to the base current to increase or decrease the current across the resistor ladder. The additional temperature compensation current is calculated and applied as an absolute quantity. Because the trim offset current is determined independently from the temperature compensated base current, the trim offset introduces a degree of non-compensated offset current which does not track with real-time changes in temperature. These non-compensated offset currents result in the voltage variations over temperature as shown in plot lines 203.

In an exemplary embodiment according to this disclosure, a trim current is provided which is a ratio of the temperature compensated base current. That is, a percentage or ratio of the temperature compensated base current is extracted and fed back in to the base current to trim the reference current in order to maintain proper reference voltages across the resistor ladder as temperature changes. In this way, additional trim offset current is tied to (e.g. a function of) the temperature compensated base current. Therefore, the offset trim current tracks with temperature changes, which are manifest in the temperature compensated base current.

Referring again to FIG. 2, plot lines 205 indicate the reference voltage level across the resistor ladder using a trim offset current corresponding to a ratio of the temperature compensated base current. Plot lines 205 show little change in voltage over the temperature range due to the trim current, which is adjusted in a way that tracks the temperature changes. As temperature changes, the temperature compensation circuit provides temperature compensated base current. As the base current changes, the amount of trim offset current changes proportionately. Therefore, a trim offset current is provided that compensates for the effect of temperature change on the resistance of resistors in the resistance ladder. The result of applying the fully temperature compensated reference current to the resistor ladder is a stable reference voltage across a range of temperatures.

Figure 3:
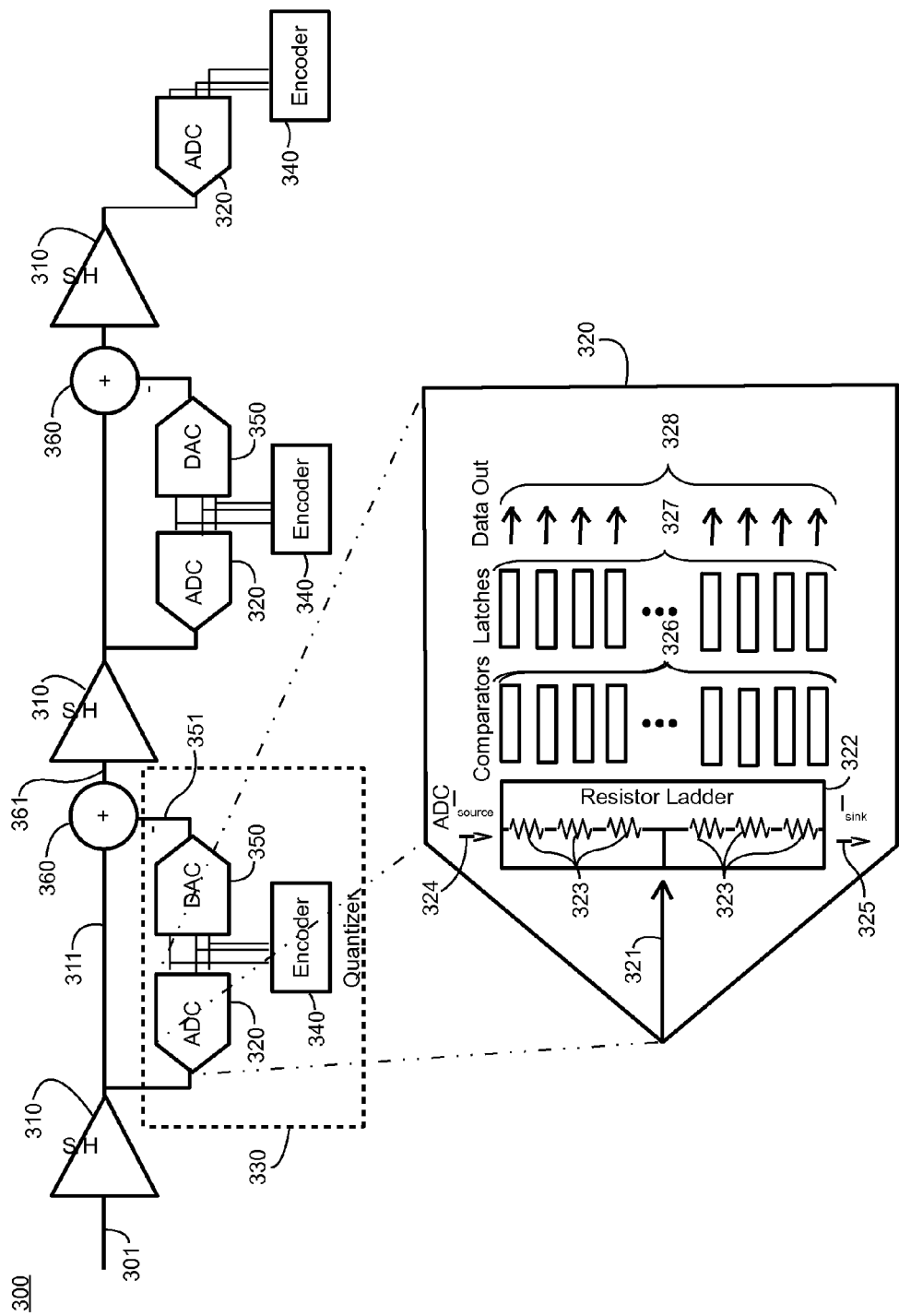
FIG. 3 is a schematic block diagram of a sub-ranging ADC according to an embodiment of the disclosure.

FIG. 3 is a schematic block diagram illustrating a sub-ranging ADC Architecture 300. In a typical sub-ranging ADC architecture, a series of pipeline connected ADC/DAC pairs are used to convert a corresponding portion of the analog input signal 301. Each ADC/DAC pair utilizes the ADC 320 to generate a digital value that is provided to the encoder 340. Referring to the architecture shown in FIG. 3, a sample and hold circuit 310 samples the analog input signal 301 and stores the sampled voltage values. The voltage samples are input to the ADC 320. The ADC 320 converts the sampled voltage levels to a digital sample value in encoder 340. The sub-ranging ADC architecture 300 comprises a number of pipelined stages, where each stage includes a quantizer 330. Quantizer 330 includes an ADC 320, encoder 340 and a DAC 350. Each quantizer 330 processes a portion of the digital output signal. For example, each quantizer 330 may encode a given number of bits of the final digital output. The portion of the signal encoded by the quantizer 330 is converted back to an analog signal by DAC 350. The DAC 350 analog output signal 351 is subtracted from the previous stage's input signal 311 in summing circuit 360. The resulting net output signal 361 is processed by the subsequent quantizer stage to produce the next portion of the digital output signal for the sub-ranging ADC 300. The output signal 361 of a previous quantizer stage serves to provide the input for the next quantizer stage defining a pipelined process. This pipelined process continues over each quantizing stage until all portions of the input signal have been converted to digital signals. The resulting digital outputs of the quantizing stages are combined to form the final digital output.

ADC 320 may be a flash (or parallel) ADC 320 which includes a resistor ladder 322 and a comparator 326 associated with each resistor 323 in the resistor ladder 322. The input signal voltage 321 crosses each resistor 323 in resistor ladder 322, and the associated comparator 326 determines whether the input signal voltage is higher (or lower) than the voltage across resistors 323 by reference current $I_{source}$ 324 and $I_{sink}$ 325. The comparators 326 output a zero or one value to indicate whether or not the input signal voltage 321 value exceeds the voltage level for a corresponding resistor 323. The comparator output is sent to a latch 327 to control the time at which the output values from the comparators may change. The output data 328 is then output from the latches 327 and output to the encoder 340 and the DAC 350 of the quantizer 330 stage.

Flash ADCs require a temperature compensated reference current which generates stable voltage drops within the architecture's quantizing resistor ladder. This is typically accomplished through replica biasing. Additionally, voltage drops in the real or output resistor ladder must be trimmed to the appropriate voltages in order to account for process variation. Existing trimming methods add a non-temperature compensated offset to the voltages, which degrades performance.

Figure 4:
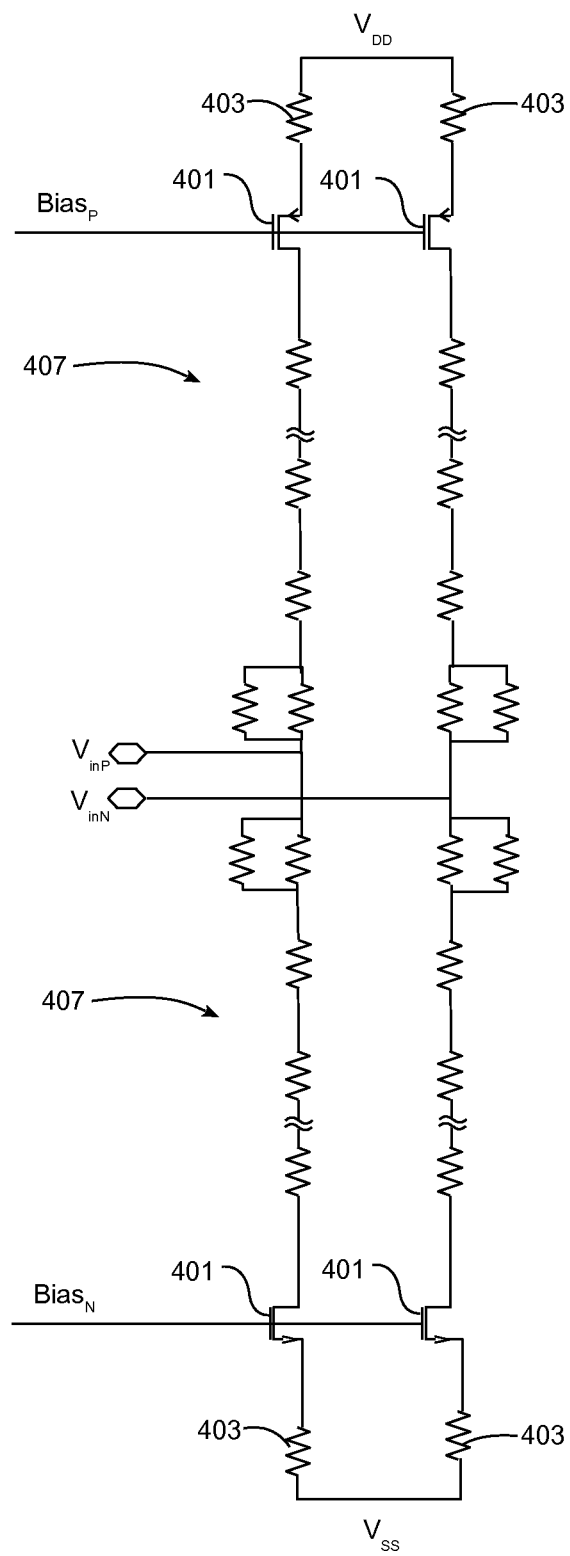
FIG. 4 is a schematic diagram of a resistor ladder in a sub-ranging ADC.

Temperature compensation is applied to the reference current to adjust the reference current to compensate for resistance changes occurring due to temperature changes. Additionally, the reference current must be trimmed or calibrated to account for process and mismatch errors in the manufacturing process. Conventional trimming methods include adjusting either the resistors or the voltages. These methods add a non-temperature compensated offset to the compensation current as shown with reference to FIG. 4. The voltage at the emitters of biasing transistors 401 is typically controlled through a voltage DAC or a series of resistors which are selectively switched in and/or out of the circuit to control voltage at the transistor 401 emitters, or by directly adjusting the resistances of resistors 403. Directly adjusting the resistance values of resistors 403 requires etching techniques which may only be performed during manufacture. The addition of a voltage trim adds non-temperature compensated trim to the quantizer resistor ladder 407 voltage. These techniques result in situations where the more trim offset that is applied, the more the final reference current deviates as a result of changes in temperature. This is because the trim adjustment being generated as an absolute value. When the absolute trim adjustment is combined with the temperature compensated reference current applied to resistor ladder 407, the overall adjustment ignores the level of temperature compensation and simply applies the absolute trim adjustment value. In cases where the temperature compensation is small, the absolute trim adjustment has a greater weighted effect on the trimmed current and resulting ladder voltages. Where more temperature compensation is provided due to a larger change in temperature, the absolute trim adjustment does not account for the larger temperature compensation. The resulting trim adjustment is therefore afforded less weight in the overall trim adjustments and deviates from the actual temperature change. The larger the trim adjustment, the more the resulting trimmed current will deviate from the ideal temperature compensated reference current.

Figure 5A:
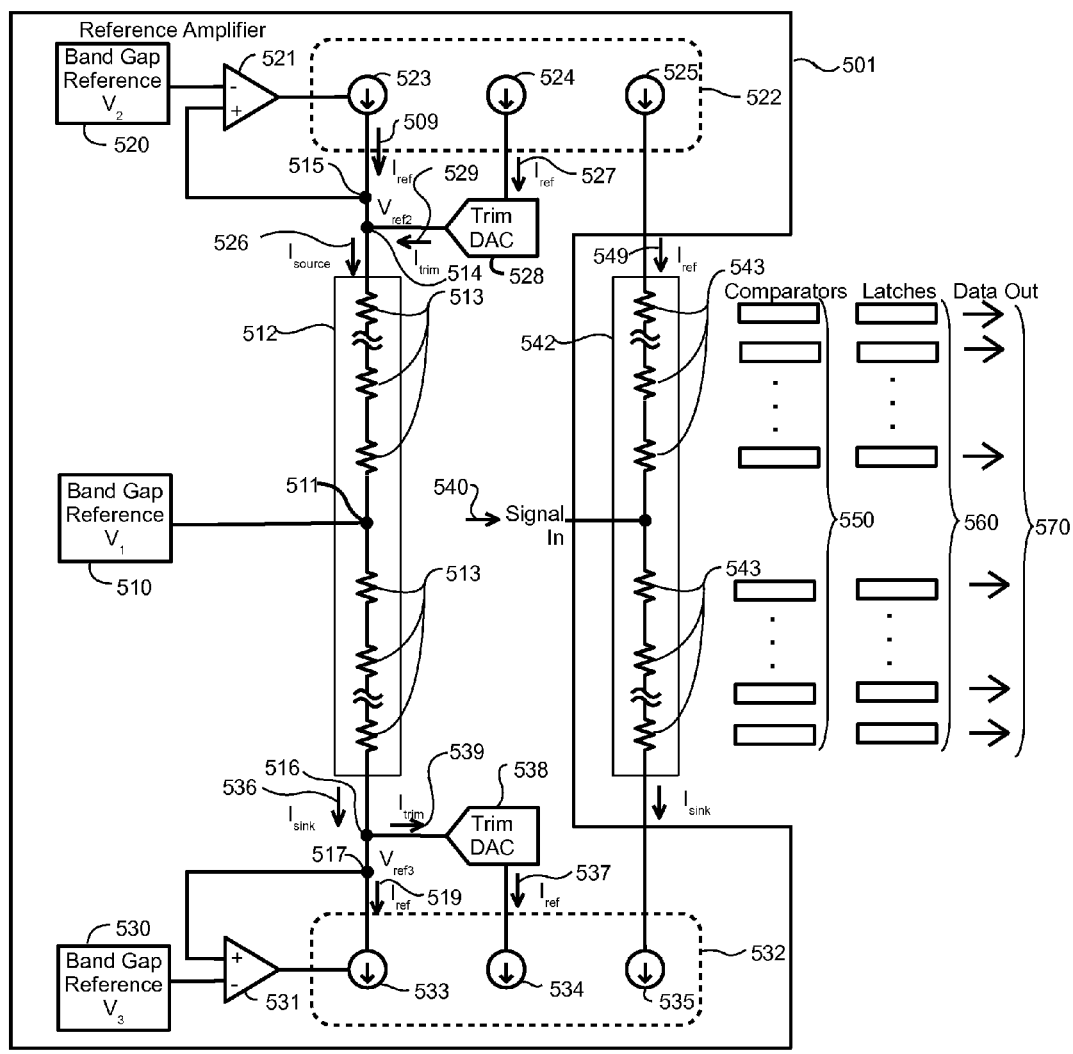
FIG. 5A is a schematic block diagram of an ADC having ratioed trim current according to an embodiment of the disclosure.

FIG. 5A is a notational schematic block diagram of an ADC configured for temperature compensation of the resistance ladder and trim current according to an embodiment of the disclosure. Reference amplifier 501 receives three band gap reference voltages 510, 520, 530. Band gap reference voltages produce a stable reference voltage that does not vary over temperature. Band gap reference voltage 510 is applied to node 511 located between a plurality of series connected resistors 513 which define replica resistor ladder 512. The replica resistor ladder 512 includes resistors having the same number of resistors and corresponding resistance values of the resistors in the output resistor ladder 542. The replica ladder 512 experiences the same temperature fluctuations as output resistor ladder 542 and exhibits the same change in resistance based on the temperature variations. The replica resistor ladder 512 allows the changes in resistance across the output resistor ladder 542 to be compensated by configuring trim current at the replica resistor ladder. The compensated current may then be mirrored and applied to the output resistor ladder 542 to provide temperature compensated current across the output resistor ladder 542. Band gap reference voltage ($V_2$) 520 is applied to the inverting input of operational amplifier (operational amplifier) 521. The output of operational amplifier 521 produces a voltage, which modulates the current output of current source 523. Current source 523 outputs an adjusted temperature compensated reference current 509. The non-adjusted temperature compensated reference current 526 flows through resistor ladder 512. The resistance of resistor ladder 512 creates a reference voltage at feedback node 515, which is fed back to the non-inverting input of operational amplifier 521. Operational amplifier 521 is configured to maintain a zero voltage differential across the inverting and non-inverting inputs of operational amplifier 521. As the band gap reference voltage 520 is constant over changing temperatures, the zero voltage differential at the inputs to operational amplifier 521 is maintained by controlling the voltage at feedback node 515 by altering the adjusted temperature compensated reference current 509. The output of operational amplifier 521 is controlled in order to modulate current source 523 and produce the adjusted temperature compensated current needed to maintain the reference voltage at feedback node 515 equal to the band gap reference voltage 520 received at the non-inverting and inverting inputs of operational amplifier 521, respectively.

Current source 523 is mirrored via current mirror 522 at current source 524. A current mirror 522 is a circuit designed to copy a current through one active device (e.g. current source 524) by controlling the current in another active device (e.g. current source 522). The replicated adjusted reference current 527 is input to a trim digital to analog converter (trim DAC) 528. Trim DAC 528 is configured to receive an input current and output a current that is a fractional proportion of the input current provided to the trim DAC 528. Trim DAC 528 outputs trim current 529, which is a percentage or fractional portion of the replicated adjusted reference current 527. Trim current 529 is provided to node 514 at a first end of replica resistor ladder 512. In addition, adjusted temperature compensated reference current 509 is provided to node 514 and combined with trim current 529 to form temperature compensated adjusted reference current 526. The temperature compensated adjusted reference current 526 determines the voltage level at feedback node 515, which is fed back to the non-inverting output of operational amplifier 521. Because trim DAC 528 returns a percentage of the mirrored adjusted temperature compensated current 527, the resulting trim current 529 is inherently temperature compensated. That is, the amount of current that is attributable to temperature compensation in the adjusted temperature compensated reference current results in trim current 529 being proportionately greater (or less) based on the adjusted temperature compensated reference current 509. As the trim current 529 is combined with the adjusted temperature compensated reference current 509 to create temperature compensated adjusted reference current 526, the voltage level at feedback node 515 will change as temperature compensated adjusted reference current 526 increases or decreases. The voltage level at feedback node 515 is fed back to the non-inverting input of operational amplifier 521. Operational amplifier 521 then outputs a modulating voltage to current source 523 to maintain a zero voltage differential at the non-inverting and inverting inputs (which corresponds to band gap reference voltage 520) of operational amplifier 521. The output of operational amplifier 521 is adjusted based on the differential between the operational amplifier 521 inputs and is used to modulate the current output of current source 523 to update and adjust the adjusted temperature compensated reference current 509 based on a voltage differential detected at feedback node 515. The newly adjusted reference current 509 is mirrored 522 to current source 524 and input to trim DAC 528 to produce an updated trim current 529.

It should also be noted that temperature variations experienced by the ADC 500 may affect the resistances of the resistors 513 of replica resistor ladder 512. For example, temperature increases may cause the resistance of resistors 513 to decrease providing less resistance across resistor ladder 512 causing the voltage level at feedback node 515 to change. This change in voltage is applied to the non-inverting input of operational amplifier 521. A voltage differential is then created with respect to the inverting input which receives band gap voltage 520, which doesn't change with temperature (i.e. a temperature independent reference voltage). The voltage differential at the inputs of operational amplifier 521 causes operational amplifier 521 to output a voltage that is operative to modulate current source 523 to produce adjusted temperature compensated reference current 509 at a level to account for the change in temperature experienced by the ADC 500. The adjusted reference current is mirrored via current source 525 across output resistor ladder 542.

Replica resistor ladder 512 is a replica of output resistor ladder 542. Output resistor ladder 542, shown notationally in FIG. 5A as a plurality of series resistances 543, receives an input signal 540. The input signal 540 is compared at nodes located between resistances 543 at comparators 550. Comparators 550 compare the voltage levels between a node in output resistor ladder 542 and a reference voltage (single ended). The comparators 550 output a high or low (0 or 1) signal based on the comparison. The output signals of comparators 550 are stored in a latch circuit 560 until the next clock cycle. The output signals are encoded and output as digital output signal 570. Voltage levels used as voltage references between resistances 543 in the output resistor ladder 542 are controlled via an output reference current 549 flowing through the output resistor ladder 542. Output reference current 549 is mirrored from the adjusted temperature compensated reference current 509 at current source 523. Thus, the output reference current 549 includes the calibration and adjustments made to the adjusted temperature compensated reference current 509 with respect to the changes detected in the voltage level at feedback node 515 across the replica resistor ladder 512. The replica resistor ladder 512 is configured to be a close replica of the resistances 543 of output resistor ladder 542. When designing the circuit, replica resistor ladder 512 and the two resistor ladders in output resistor ladder 542 (shown for receiving a differential input signal in FIG. 5B) are positioned near one another and oriented similarly so that temperature changes affecting one of the resistor ladders will affect the others in a similar way. Current mirror 522 mirrors the adjusted temperature compensated reference current 509, adjusted for variations detected across replica resistor ladder 512, at current source 525 to produce output reference current 549, which flows across the output resistor ladder 542.

For differential inputs, band gap reference voltage 530 is applied to the inverting input of operational amplifier 531. The non-inverting input of operational amplifier 531 receives a voltage level measured at node 517. Operational amplifier 531 operates similarly to operational amplifier 521 described above to modulate current at current source 533 based on the differential between the voltage level at node 517 and band gap reference voltage 530. The adjusted reference current 519 is mirrored at current source 534 which is connected to trim DAC 538 which creates a trim current 539 which is a fractional percentage of the non-adjusted temperature compensated current 536 flowing through replica resistor ladder 512. The adjusted temperature compensated reference current 519 is mirrored by current mirror 532 at current source 535 across the output resistor ladder 542.

Figure 5B:
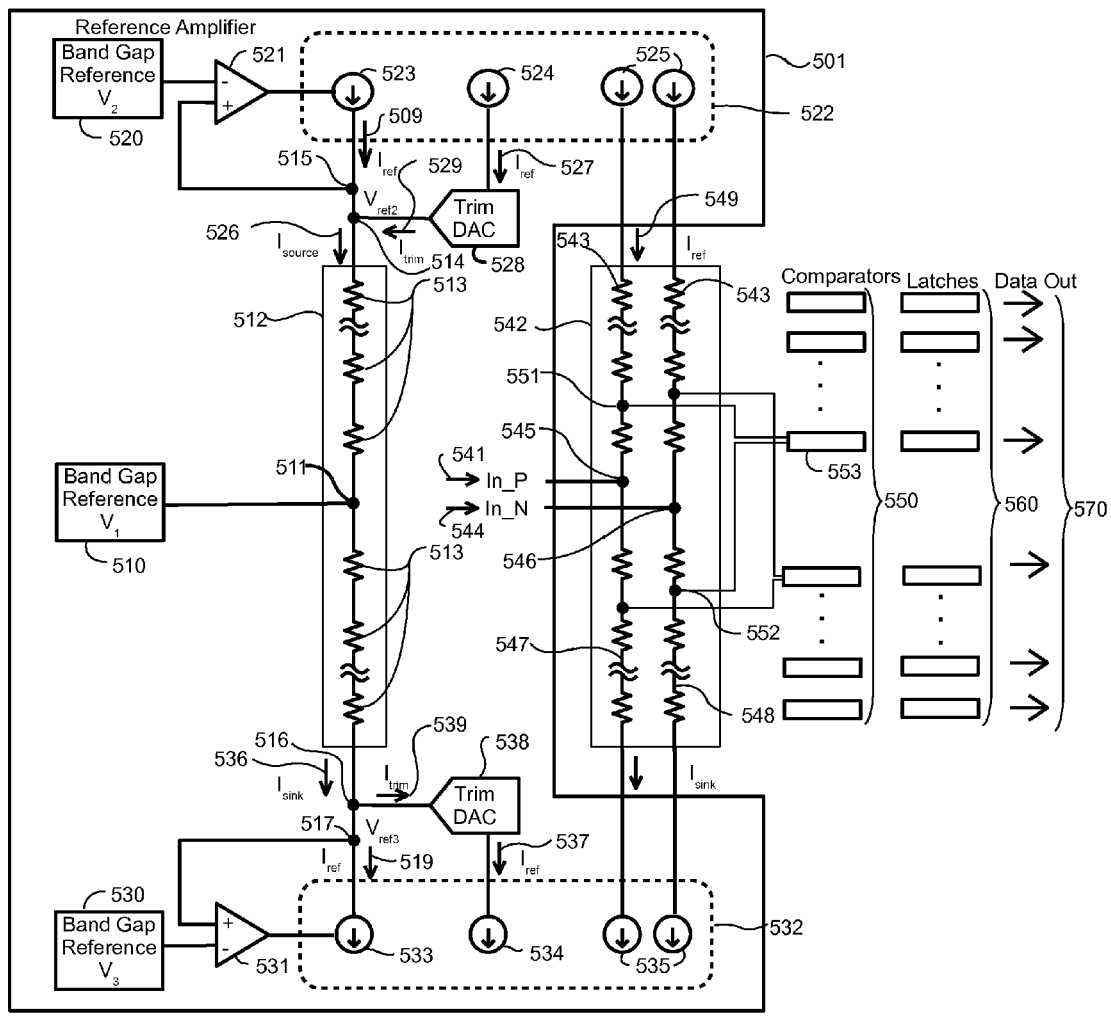
FIG. 5B is a schematic block diagram of an ADC similar to that of FIG. 5A having showing two resistor ladders in the output resistor ladder arrangement for receiving a differential input signal.

Referring now to FIG. 5B, the output resistor ladder 542 is shown having two differential resistor ladders 547, 548. A positive input signal 541 is input to resistor ladder 547 at node 545. A negative input signal 544 is input to resistor ladder 548 at node 546. Positive input signal 541 and negative input signal 544 define a differential input signal, which is used to determine a digital value representative of the differential input signal. The voltage level at a node 551 on the positive input resistor ladder 547 is compared to the voltage level at a corresponding node 552 on the negative input resistor ladder 548 by comparator 553. Comparator 553 outputs a digital signal representing if the voltage level at the first node 551 is greater than the corresponding node 552. If greater, the comparator 553 outputs a 1, otherwise the comparator outputs a 0. Each comparator 550 performs a comparison of a corresponding pair of nodes on the positive resistor ladder 547 and the negative input resistor ladder 548. Based on the voltage of the differential input, comparators 550 output a series of 1's and 0's defining a digital signal representative of the differential input voltage value. The digital signal is encoded as an output as the digital output signal 570 of the ADC 500.

Figure 6A:
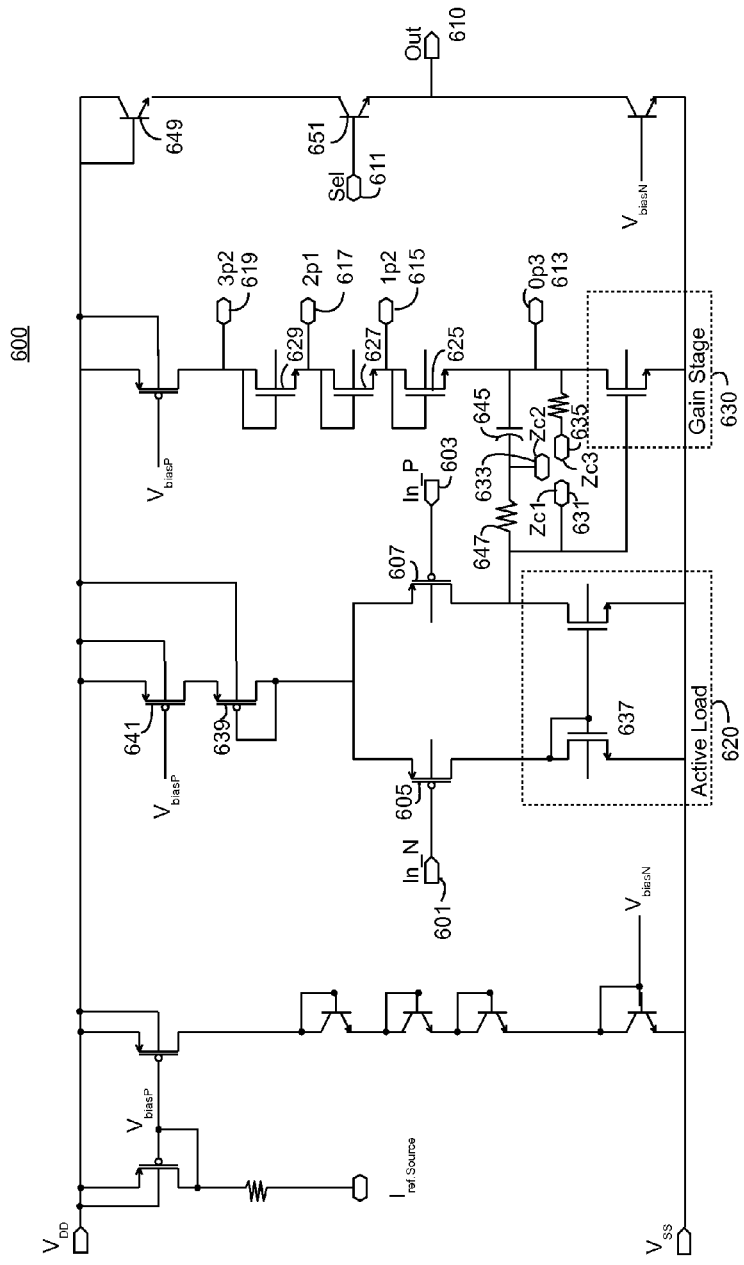
FIG. 6A is a schematic diagram of a temperature compensated operational amplifier according to an embodiment of the disclosure.
Figure 6B:
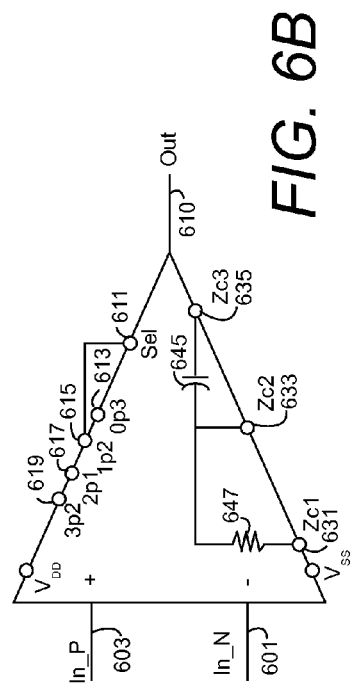
FIG. 6B is a symbolic schematic diagram of the operational amplifier of FIG. 6A.

FIG. 6A is a schematic diagram of a temperature stable operational amplifier (operational amplifier) 600 according to an embodiment of the disclosure. FIG. 6B is a symbolic diagram of the op-amp of FIG. 6A. Operational amplifiers may be operated at high open loop gain to lower the input offset. However, high open gain operation limits the type of input stages which may be used. The operational amplifier 600 of FIGS. 6A and 6B provides temperature compensation to the input gain stage 630 to temperature compensate the input offset voltage. Still referring to FIG. 6A, a differential input 601, 603 is applied to input transistor pair 605, 607. A common source amplifier 630 boosts the gain. However, a differential zero input at the first gain stage (differential pair 605, 607 and active load 620) of the operational amplifier 600 does not necessarily correspond to a mid-scale single ended output, thereby generating an offset at the first gain stage. A low gain front end stage contributes to higher input offset voltage. In reference style circuits, the input offset can be temperature sensitive, which can lead to output variations across temperature. Conventionally, in similar reference circuitry, higher performance operational amplifiers are required to minimize input offset to avoid these issues. Using specifically sized devices such that the larger input offset is more stable over temperature, allows for use of a simple operational amplifier. Specifically, this is achieved by matching the W/L ratios as well as current density through the transistors in active load 620 and gain stage 630. This enables using less chip area and current in the reference circuitry.

The output 610 of operational amplifier 600 may be controlled through selectively connecting node 611 to one of nodes 613, 615, 617, and 619 to select the desired output stage. Stability compensation is provided by feeding back the output of gain stage 630 through capacitor 645 to node 633 and then through resistor 647 to the input of gain stage 630.

Figure 7:
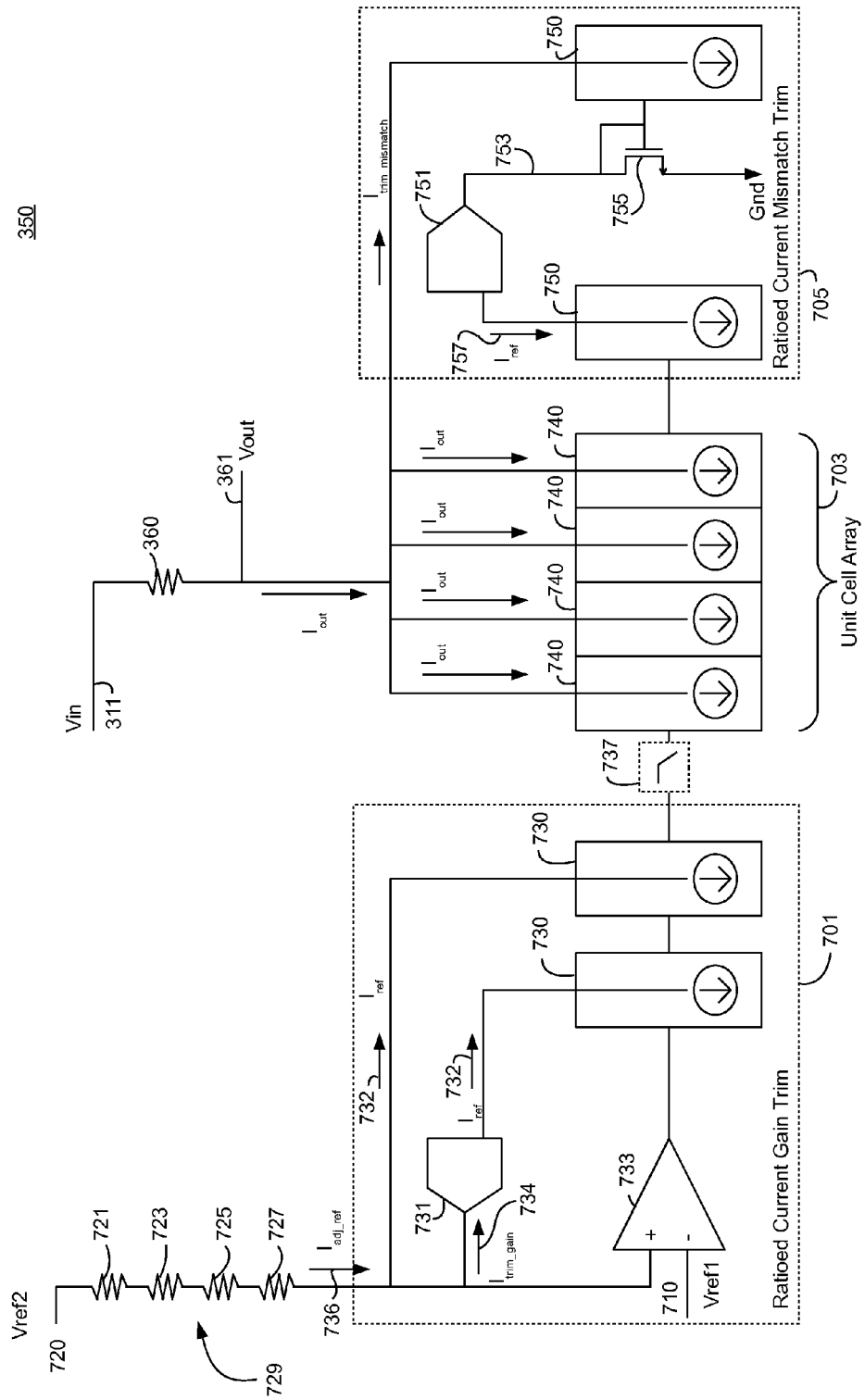
FIG. 7 is a schematic block diagram of a digital to analog converter having ratioed gain trim and mismatch trim according to an embodiment of the disclosure.

FIG. 7 is a schematic diagram of a digital to analog converter (DAC) configured to provide temperature compensated gain control and trim adjustment according to an embodiment of the disclosure. The DAC 350 in FIG. 7 provides a DAC architecture that could be used in the sub-ranging ADC shown above in FIG. 3. DAC 350 provides temperature compensated trim for current gain 701 and for mismatch 705. DAC 350 comprises a plurality of unit cells 740 in a unit cell array 703. Each unit cell 740 may be configured to be "on" or "off". The unit cell array 703 creates a current that is representative of a digital input signal. The current created is the summation of the current flowing through each of the unit cells 740 which are on. The current flows through resistor 360 positioned between the $V_{in}$ input signal 311 and the $V_{out}$ output signal 361. For a 4 bit DAC, unit cell array 703 would comprise 16 unit cells 740. Other configurations of unit cell array 703 may be used.

In response to temperature fluctuations, the current weights change with temperature. It should be noted that the resistance of resistor 360 will also change with temperature. Therefore, the two types of temperature compensated trim that need to be addressed relate to the overall height as well as the input mismatch that may occur from the DAC chain itself or may be characteristic of mismatches in the unit cells 740.

To compensate the overall height, or current gain, trim is provided by the portion of the DAC 350 in block 701. "Dummy" or replica versions of the unit cells 730 are used to feed current across a replica version 729 of the resistor 360 in the output path. The replica unit cells 730 provide a current across the replica resistor 729. As temperature fluctuations affect the output resistor 360, they similarly affect the replica resistor 729 and affect the current flowing through replica unit cells 730. Operational amp 733 maintains a compensated voltage at the bottom of replica resistors 729 by updating the current flowing through replica unit cells 730, 740, and 750 to maintain a zero differential between Vref1 710 and the voltage at the non-inverting input of operational amplifier 733.

Resistors 721, 723, 725, and 727 provide a replica resistance which replicates the output resistor 360. The replica resistor 729 is positioned in series between reference voltage $V_{ref2}$ 720 and the positive (non-inverting) input (In_P) of operational amplifier 733. Reference voltage $V_{ref1}$ is applied to negative input of operational amplifier 733. The voltage difference between $V_{ref2}$ 720 and $V_{ref1}$ 710 provides for reference current $I_{ref}$ 732. Replica unit cells 730 pull reference current 732 through trim DAC 731 to produce trim current $I_{trim}$ 734. Trim DAC 731 produces a current output ($I_{trim}$ 734) which is a percentage of the reference current $I_{ref}$ 732 which in turn, combines with reference current 732 to produce an adjusted reference current 736. The proportional temperature compensated trim current $I_{trim}$ 734 provides a temperature compensated trim current which adjusts with temperature fluctuations that affect the reference current $I_{ref}$ 732. Optionally, a low pass filter 737 may be disposed between replica unit cell 730 and the output unit cells 740 in the unit cell array 703 to remove noise created in the gain stage from reaching the output signal 361. Low pass filter 737 may be implemented as a series resistance and a shunt capacitance between replica unit cell 730 and output unit cell 740. Without filtering, noise generated within the DAC gain phase is quantized in each quantizer stage of sub-ranging ADC architecture, thereby adding to the noise level in the final output.

To compensate for mismatch, the portion of DAC 350 shown in block 705 provides mismatch trim. Replica unit cells 750 pull reference current from the common connection of each unit cell 740 in the unit cell array 703 to output signal 361. The reference current 757 is drawn through trim DAC 751 and outputs current 753 that is a percentage of the reference current $I_{ref}$ 757. The proportional output current 753 is applied to the replica unit cells 750 through transistor 755. In this way the mismatch current is temperature compensated by output current 753 which is always proportional to the reference current, thereby providing a current mismatch trim that provides a temperature compensated trim current that changes with fluctuations in the reference current due to temperature changes.

Figure 8:
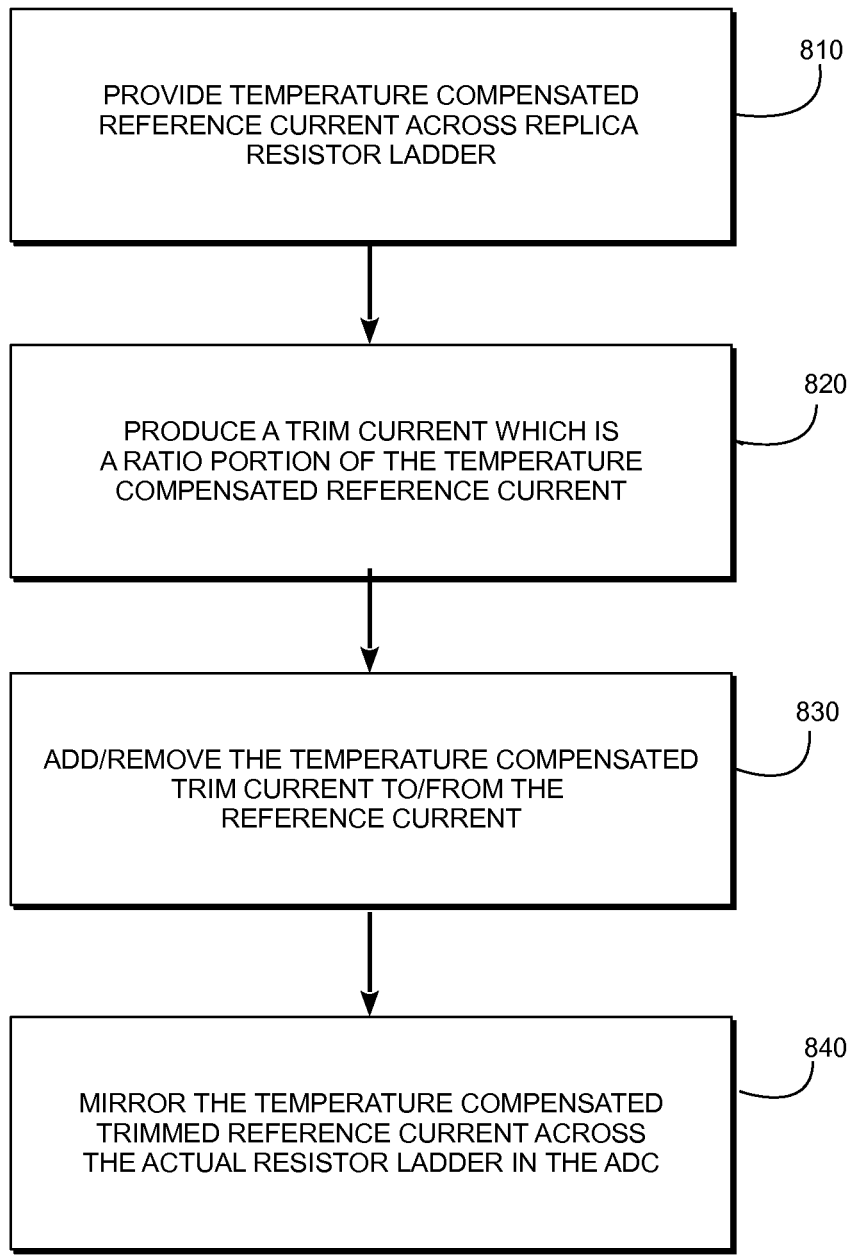
FIG. 8 shows an exemplary process flow for providing temperature compensated trimming for a reference current in an analog to digital converter.

FIG. 8 is a process flow diagram of a method for providing temperature compensated trim in an ADC. At step 810 a temperature compensated reference current is provided to be applied across a replica resistance ladder. The temperature compensated reference current is divided to provide a trim current that is a fractional portion or ratio of the temperature compensated reference current at step 820. The trim current is added to or subtracted from the original temperature compensated reference current to produce an adjusted temperature compensated reference current at step 830. The adjusted temperature compensated reference current is mirrored and applied across the output resistance ladder (step 840) to produce a temperature compensated output.

While the foregoing invention has been described with reference to the above-described embodiment, various modifications and changes can be made without departing from the spirit of the invention. Accordingly, all such modifications and changes are considered to be within the scope of the appended claims. Accordingly, the specification and the drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations of variations of various embodiments. Combinations of the above embodiments, and other embodiments not specifically described herein, will be apparent to those of skill in the art upon reviewing the above description.

What is claimed is:

1. An analog to digital converter (ADC) for providing a temperature compensated reference current to an output resistor ladder comprising:
   an operational amplifier (opamp) having a first voltage input and a second voltage input, said opamp configured to output a modulated output signal based on a differential voltage between said first and second voltage inputs;
   a first current source coupled to a replica resistor ladder, said replica resistor ladder being a replica of said output resistor ladder, said first current source configured to receive said modulated output signal and to output an adjusted reference current responsive to said modulated output signal;
   a second current source configured to mirror said adjusted reference current;
   a trim digital to analog converter (DAC) coupled to said second current source, said trim DAC configured to receive the mirrored adjusted reference current and to output a trim current that represents a percentage of said mirrored adjusted reference current, wherein said trim current is combined with said adjusted reference current across said replica resistor ladder at a feedback node between said first current source and said replica resistor ladder to produce a voltage level at said feedback node, said voltage level being fed back to one of said first and second inputs of said operational amplifier; and
   a temperature independent reference voltage source that is provided to the other of said first and second input of said operational amplifier that does not receive said feedback node voltage level.

2. The ADC of claim 1, wherein the modulated output signal is representative of a change in temperature based on a change in resistance of said replica resistor ladder.

3. The ADC of claim 1, further comprising:
   an output current source coupled to said output resistor ladder and configured to mirror said adjusted reference current across said output resistor ladder.

4. The ADC of claim 3, wherein said output resistor ladder comprises:
   a first plurality of series connected resistors connected at a first end to said third current source and configured to receive a first input of a differential input signal at a first input node located between two of said first plurality of series connected resistors;
   a second plurality of series connected resistors connected at a first end to said third current source and configured to receive a second input of said differential input signal at a second input node located between two of said second plurality of series connected resistors.

5. The ADC of claim 4, wherein said replica resistor ladder is a replica of one of said first plurality of series connected resistors and said second plurality of series connected resistors.

6. The ADC of claim 5, further comprising:
   a plurality of comparator circuits, each comparator circuit of said plurality of comparator circuits associated with a node located between two adjacent resistors in said first plurality of series connected resistors, and a corresponding node between two adjacent resistors of said second plurality of series connected resistors.

7. The ADC of claim 6, wherein each of said plurality of comparator circuits is configured to:
   compare a first voltage at said associated node located between two adjacent resistors of said first plurality of series connected resistors, and a second voltage at said associated node located between two adjacent resistors of said second plurality of series connected resistors and based on said comparison;
   output a first output value if said first voltage is greater than said second voltage; and
   output a second output value if said first voltage is less than or equal to said second voltage.

8. The ADC of claim 7, further comprising a plurality of latch circuits, each latch circuit of said plurality of latch circuits corresponding to one of said plurality of comparator circuits, each latch circuit configured to receive the output value of said corresponding comparator circuit and to maintain said comparator output value for a predetermined time.

9. The ADC of claim 1, wherein said first input of said opamp is an inverting input, and said second input of said opamp is a non-inverting input, and said opamp is configured to produce a modulated output signal, that when applied to said first current source, produces said adjusted reference current that generates a voltage level at said feedback node which maintains a zero voltage differential across said first and second inputs of said opamp.

10. The ADC of claim 1, further comprising:
    a second operational amplifier (opamp) having a first voltage input and a second voltage input, said second opamp configured to output a modulated output signal based on a differential voltage between said first and second voltage inputs of said second operational amplifier;
    a third current source coupled to said replica resistor ladder at an end opposing said first current source, said replica resistor ladder being a replica of said output resistor ladder, and said third current source configured to receive said modulated output signal of said second operational amplifier and to output a second adjusted reference current responsive to said modulated output signal of said second operational amplifier;
    a fourth current source configured to mirror said second adjusted reference current;
    a second trim DAC coupled to said fourth current source, said second trim DAC configured to receive the mirrored adjusted reference current and to output a second trim current that represents a percentage of said mirrored second adjusted reference current, wherein said second trim current is combined with said second adjusted reference current across said replica resistor ladder at a second feedback node between said third current source and said second end of said replica resistor ladder producing a second voltage level at said second feedback node said second voltage level being fed back to the one of said first and second inputs of said second operational amplifier; and a second temperature independent reference voltage source that is provided to the other of said first and second input of said second operational amplifier that does not receive said second feedback node voltage level.

11. The ADC of claim 10, further comprising:
a first output current source connected to said output resistor ladder at a second end opposite a second output current source, said first output current source configured to mirror said second adjusted reference current.

12. The ADC of claim 11, further comprising:
a third temperature independent reference voltage source connected to a third input node located between two adjacent resistors of said replica resistor ladder.

13. A temperature compensated digital to analog converter (DAC) comprising:
an input for receiving a digital input signal;
an output for outputting a voltage representative of said digital input signal;
an output resistor connected between said input and said output;
an array of unit cells configured to create a current through said output resistor representative of said digital input signal;
a current gain control circuit comprising:
at least one replica unit cell configured to draw a temperature compensated reference current across at least one replica resistor, the at least one replica resistor configured to replicate said output resistor of the temperature compensated DAC, wherein said at least one replica unit cell is connected to a plurality of output unit cells for producing an output voltage level across said output resistor;
a trim DAC connected to the at least one replica cell, the trim DAC configured to receive the temperature compensated reference current and output a fractional portion of said temperature compensated reference current to produce a temperature compensated trim current, the temperature compensated trim current fed back to said temperature compensated reference current to produce an adjusted reference current; and
an operational amplifier for amplifying an input reference voltage based on the trimmed adjusted reference current and the at least one replica resistor.

14. The DAC of claim 13, further comprising:
a current mismatch circuit comprising:
at least one replica unit cell configured to draw a temperature compensated mismatch current, wherein said at least one replica cell is connected to said plurality of output unit cells;
a second trim DAC configured to receive the temperature compensated reference current and output a fractional portion of said temperature compensated reference current as a temperature compensated mismatch trim current, wherein said mismatch trim current is mirrored through one replica unit cell to produce a trimmed mismatch current across said output resistor for generating a trimmed temperature compensated output voltage level at an output of said temperature compensated DAC.

15. The DAC of claim 13, wherein the input to said temperature compensated DAC represents the digital output of a temperature compensated analog to digital converter (ADC) of a quantizer stage in a sub-ranging ADC.

16. The DAC of claim 13, wherein said replica resistor comprises a plurality of resistors.

17. The DAC of claim 13, further comprising a low-pass filter between said at least one replica cell of said current gain trim circuit and said plurality of output unit cells, said low pass filter configured to filter out noise from said current gain trim circuit.

18. The DAC of claim 17, wherein said low pass filter comprises a capacitor connected in series between one of said plurality of replica cells of the current gain trim circuit and at least one of said output unit cells.

19. A method of providing a temperature compensated reference current to an analog to digital converter (ADC), comprising the steps of:
providing a temperature compensated reference current in a first current source across a first resistor ladder, the first resistor ladder comprising a plurality of series-connected resistors;
mirroring said temperature compensated reference current at a second current source;
applying said mirrored temperature compensated reference current to a trim digital to analog converter (DAC), the trim DAC configured to output a fractional portion of the temperature compensated reference current as a temperature compensated trim current;
providing via a feedback loop said temperature compensated trim current to said temperature compensated reference current to produce an adjusted temperature compensated reference current.

20. An apparatus for providing temperature compensation to a resistive device comprising:
a first current source providing an adjusted temperature compensated reference current across a replica of said resistive device;
a second current source configured to mirror said adjusted temperature compensated reference current;
a trim digital to analog converter (DAC) configured to receive said mirrored adjusted temperature compensated reference current and output a temperature compensated trim current, wherein said temperature compensated trim current is a fractional portion of said mirrored adjusted temperature compensated reference current;
wherein said adjusted temperature compensated reference current and said temperature compensated trim current combine to generate an adjusted temperature compensated reference current for input to said replica of said resistive device; and
said adjusted temperature compensated reference current is mirrored across said resistive device.

* * * * *